(12) United States Patent
Maier

(10) Patent No.: US 7,298,146 B1
(45) Date of Patent: Nov. 20, 2007

(54) METHOD AND APPARATUS OF MANUAL PRE-SCAN SPATIAL AND SPECTRAL DATA ACQUISITION

(75) Inventor: Joseph K. Maier, Milwaukee, WI (US)

(73) Assignee: General Electric Compnay, Schenectady, NY (US)

(*) Notice: Subject to any disclaimer, the term of this patent is extended or adjusted under 35 U.S.C. 154(b) by 0 days.

(21) Appl. No.: 11/426,237

(22) Filed: Jun. 23, 2006

(51) Int. Cl.
*G01V 3/00* (2006.01)
(52) U.S. Cl. .................. 324/318; 324/307; 324/309
(58) Field of Classification Search ........ 324/300–322; 600/410–435
See application file for complete search history.

(56) References Cited

U.S. PATENT DOCUMENTS

| | | | | |
|---|---|---|---|---|
| 5,089,784 A | * | 2/1992 | Yoshitome et al. | 324/309 |
| 5,378,985 A | * | 1/1995 | Hinks | 324/309 |
| 5,537,039 A | * | 7/1996 | Le Roux et al. | 324/309 |
| 6,369,568 B1 | * | 4/2002 | Ma et al. | 324/309 |
| 6,570,383 B1 | * | 5/2003 | McKinnon et al. | 324/314 |
| 6,583,623 B1 | * | 6/2003 | Kwok et al. | 324/307 |
| 6,906,515 B2 | * | 6/2005 | Yatsui et al. | 324/309 |
| 6,958,605 B2 | * | 10/2005 | Dale et al. | 324/307 |
| 7,233,818 B1 | * | 6/2007 | Aletras et al. | 600/410 |

* cited by examiner

*Primary Examiner*—Diego Gutierrez
*Assistant Examiner*—Dixomara Vargas
(74) *Attorney, Agent, or Firm*—Ziolkowski Patent Solutions Group, SC

(57) ABSTRACT

A method of pre-scan data acquisition includes the application of a pre-scan pulse sequence to acquire MR signals from a region-of-interest to be imaged with an imaging pulse sequence. The pre-scan pulse sequence applies a pre-scan readout gradient pulse and a pre-scan readout gradient rewinder pulse. MR signals are acquired from a region of interest during application of the pre-scan readout gradient pulse and after application of the pre-scan readout gradient rewinder pulse.

28 Claims, 4 Drawing Sheets

METHOD AND APPARATUS OF MANUAL PRE-SCAN SPATIAL AND SPECTRAL DATA ACQUISITION

BACKGROUND OF THE INVENTION

The present invention relates generally to magnetic resonance (MR) imaging and, more particularly, to a method and apparatus that enables a user to simultaneously view spatial and spectral data acquired from the same spatial slice of tissue an MR manual pre-scan.

When a substance such as human tissue is subjected to a uniform magnetic field (polarizing field $B_0$), the individual magnetic moments of the spins in the tissue attempt to align with this polarizing field and precess about it in random order at their characteristic Larmor frequency. If the substance, or tissue, is subjected to a magnetic field (excitation field $B_1$) which is in the x-y plane and which is near the Larmor frequency, the net aligned moment, or "longitudinal magnetization", $M_z$, may be rotated, or "tipped", into the x-y plane to produce a net transverse magnetic moment $M_t$. A signal is emitted by the excited spins after the excitation signal $B_1$ is terminated and this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

Magnetic resonance imaging typically includes a patient-specific pre-scan calibration/setting of system center frequency, transmit pulse gain, fine center frequency and receive gain. When performing this multi-part procedure manually, an operator typically invokes separate pulse sequences for acquiring the center frequency data and object projection data. The operator is required to manually switch between these two modes and wait for any system software and MR physics steady state related delays before a new object projection plot or center frequency spectrum is displayed.

It would therefore be desirable to have a method and apparatus capable of reducing system software and MR physics steady state related delays caused by invoking separate pulse sequences for acquiring the center frequency data and object projection data.

BRIEF DESCRIPTION OF THE INVENTION

The present invention provides a method and apparatus of acquiring MR data in a pre-scan acquisition sequence that overcome the aforementioned drawbacks. MR data is acquired in the pre-scan acquisition sequence during application of a readout gradient pulse. MR data is also acquired after application of a post readout gradient rewinder pulse.

In accordance with one aspect of the invention, the invention is embodied in a computer program stored on a computer readable storage medium and having instructions which, when executed by a computer, cause the computer to apply a pre-scan readout gradient pulse of a pulse sequence from a region-of-interest to be imaged. A first set of MR signals is acquired from the region-of-interest during application of the pre-scan readout gradient pulse. The instructions further cause the computer to apply a pre-scan readout gradient rewinder pulse of the pulse sequence after application of the pre-scan readout gradient pulse. A second set of MR signals is acquired from the region-of-interest after application of the pre-scan readout gradient rewinder pulse.

In accordance with another aspect of the invention, an MR apparatus includes an MR system having a plurality of gradient coils positioned about a bore of a magnet to impress a polarizing magnetic field. An RF transceiver system and an RF switch are controlled by a pulse module to transmit and receive RF signals to and from an RF coil assembly to acquire MR images. The MR apparatus also includes a computer readable storage medium having stored thereon a computer program comprising instructions which when executed by a computer cause the computer to apply an MR acquisition pulse sequence having a readout gradient pulse and a post readout gradient rewinder pulse. The computer is also caused to read out a first set of MR data from a spatial slice of a region-of-interest while applying the readout gradient pulse and read out a second set of MR data from the spatial slice of the region-of-interest after applying the post readout gradient rewinder pulse.

According to another aspect, the invention is embodied in a method of acquiring MR pre-scan image data. The method includes prescribing a pre-scan pulse sequence for a slice of a region of interest, the pre-scan pulse sequence having a first data acquisition window and a second data acquisition window. The method includes acquiring MR signals from the slice during the first data acquisition window and applying a gradient rewinder pulse between the first data acquisition window and the second data acquisition window. MR signals are acquired from the slice during the second data acquisition window.

Various other features and advantages of the present invention will be made apparent from the following detailed description and the drawings.

BRIEF DESCRIPTION OF THE DRAWINGS

The drawings illustrate one preferred embodiment presently contemplated for carrying out the invention.

In the drawings.

DETAILED DESCRIPTION OF THE PREFERRED EMBODIMENT

Figure 1:
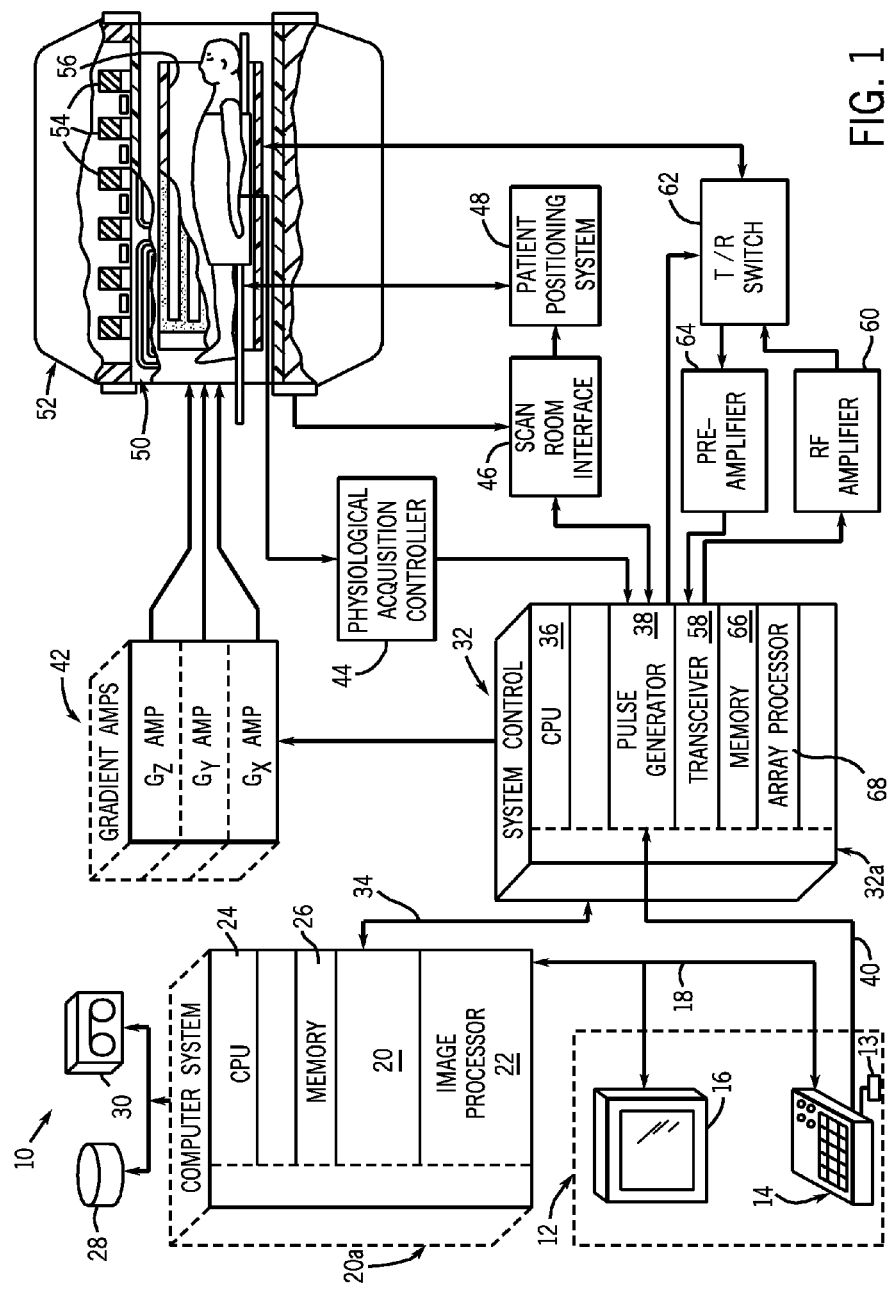
FIG. 1 is a schematic block diagram of an MR imaging system for use with the present invention.

Referring to FIG. 1, the major components of a preferred MR system 10 incorporating the present invention are shown. The operation of the system is controlled from an operator console 12 which includes a keyboard or other input device 13, a control panel 14, and a display screen 16. The console 12 communicates through a link 18 with a separate computer system 20 that enables an operator to control the production and display of images on the display screen 16. The computer system 20 includes a number of modules which communicate with each other through a backplane 20a. These include an image processor module 22, a CPU module 24 and a memory module 26, known in the art as a frame buffer for storing image data arrays. The computer system 20 is linked to disk storage 28 and tape drive 30 for storage of image data and programs, and communicates with a separate system control 32 through a high speed serial link 34. The input device 13 can include a mouse, joystick, keyboard, track ball, touch activated screen, light wand, voice control, or any similar or equivalent input device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having Gx, Gy, and Gz amplifiers. Each gradient amplifier excites a corresponding physical gradient coil in a gradient coil assembly generally designated 50 to produce the magnetic field gradients used for spatially encoding acquired signals. The gradient coil assembly 50 forms part of a magnet assembly 52 which includes a polarizing magnet 54 and a whole-body RF coil 56. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 to the coil 56 during the receive mode. The transmit/receive switch 62 can also enable a separate RF coil (for example, a surface coil) to be used in either the transmit or receive mode.

The MR signals picked up by the RF coil 56 are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory, such as disk storage 28. In response to commands received from the operator console 12, this image data may be archived in long term storage, such as on the tape drive 30, or it may be further processed by the image processor 22 and conveyed to the operator console 12 and presented on the display 16.

The present invention is directed to a method and apparatus to enable a user to interactively and/or a system to automatically determine parameters for a scan. As will be described, this interactive adjustment is through simultaneous visualization of the object projection data and the frequency spectrum. However, it is contemplated that adjustments can be made automatically without or in addition to user-visualization of the object projection and the frequency spectrum. For purposes of explanation and not limitation, the invention will be described with respect to a user-interactive technique based on simultaneous visualization of object projection data and a frequency spectrum.

The invention executes a pre-scan to acquire MR data that is used to generate an object projection plot and a frequency spectrum. The object projection plot and the frequency spectrum are displayed to the user thereby allowing the user to visualize the relative data and signals from fat and water components in a region-of-interest, such as a given acquisition slice. In one preferred example, the object projection plot may be used, for example, to visually convey information for optimizing the setting of the transmit gain, and the frequency spectrum may be used, for example, to visually convey center frequency data.

Figure 2:
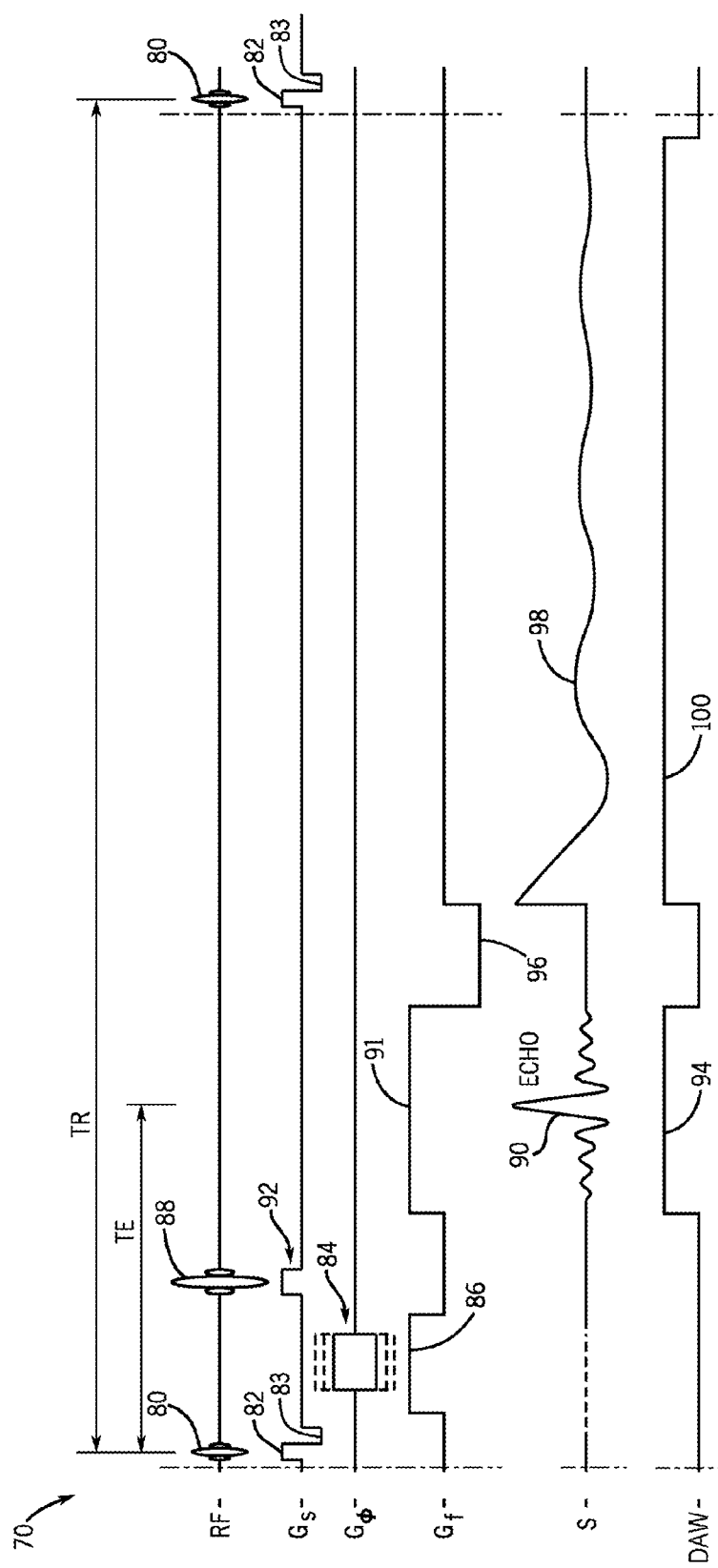
FIG. 2 is a schematic diagram of a pulse sequence for acquiring object projection data and center frequency data according to the present invention.

An exemplary imaging sequence for simultaneously acquiring object projection data and center frequency data in a single TR period is shown in FIG. 2. The pulse sequence 70 includes an RF excitation pulse 80, applied with a flip angle of θ degrees that is applied in the presence of a slice selective gradient 82 followed by a slice rephasing gradient 83, where θ is a desired angle, such as 90 degrees. Gradients 82, 83 are followed by a zero-amplitude phase encoding gradient 84 and a frequency encoding gradient 91 and associated pre-dephaser pulse 86. For purposes of illustration, the zero-amplitude phase-encoding pulse 84 is shown in phantom to illustrate that, in the present invention, no phase encoding is used during acquisition of pre-scan data. During the acquisition of imaging data, however, phase encoded data is acquired. A 2*θ degree RF rephasing pulse 88 is then applied, where 2*θ is a desired angle, such as 180 degrees. The rephasing pulse 88 is played out in the presence of slice selective gradient 92 and causes rephasing of the transverse magnetization whereupon an echo 90 is produced and is sampled for data collection under a frequency encoding readout gradient 91 during a data acquisition window 94. Data sampled from echo 90 is used to obtain an object projection plot. Following application of the frequency encoding readout gradient 91, a post readout gradient rewinder pulse 96 is applied whereupon a free induction decay (FID) signal 98 is produced and is sampled without a frequency encoding readout gradient for data collection during a bandwidth data acquisition window 100. Data sampled from echo 98 is Fourier transformed to obtain a center frequency spectrum. Preferably, bandwidth data acquisition window 100 has a lower bandwidth than the bandwidth of data acquisition window 94. In addition, the number of data samples sampled during data acquisition window 100 may be different than the number of data samples sampled during data acquisition window 94.

Figure 3:
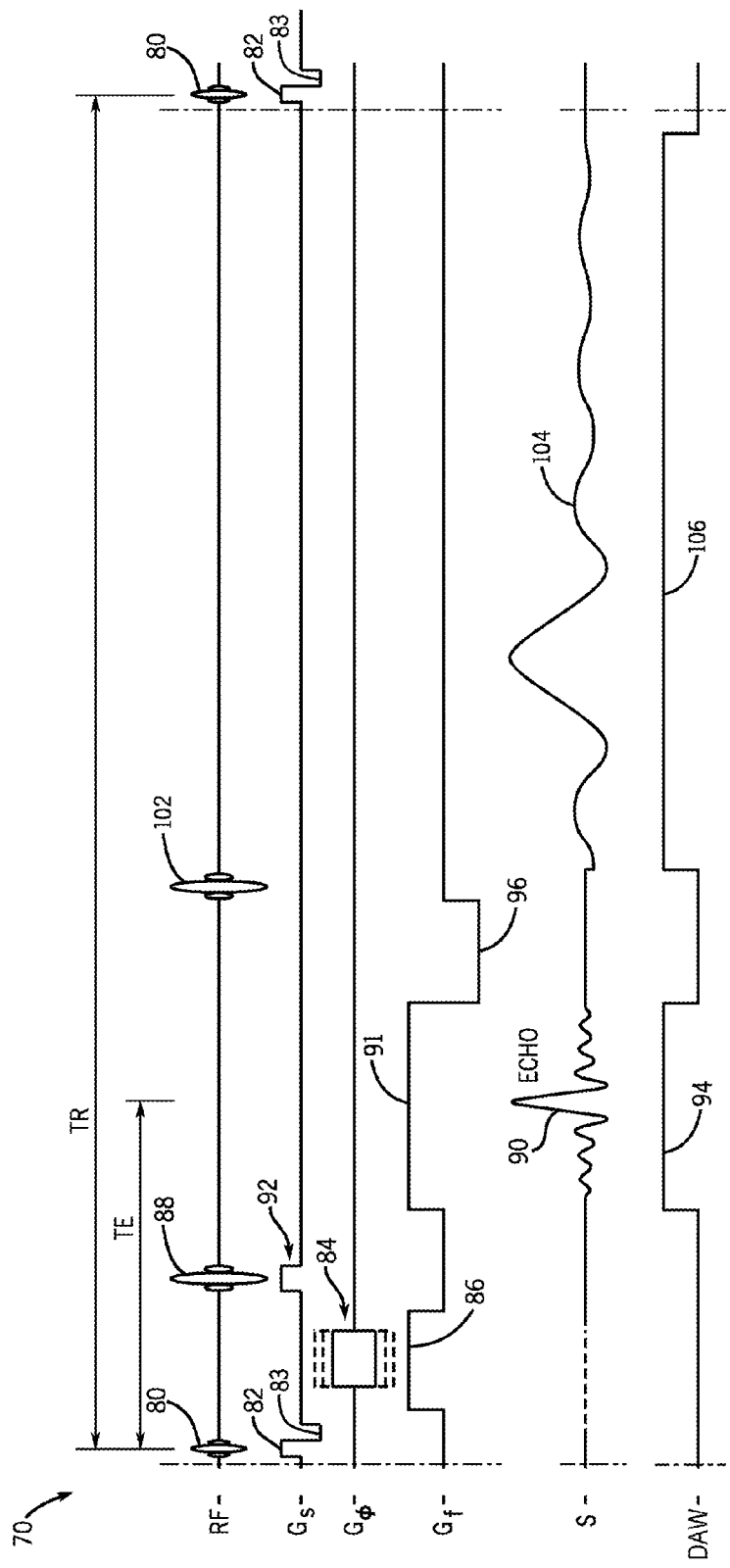
FIG. 3 is a schematic diagram of the pulse sequence of FIG. 2 including a 2*θ degree inversion pulse applied between data acquisition windows.

As shown in FIG. 3, the pulse sequence 70 of FIG. 2 may include an optional 2*θ degree inversion pulse 102 that is applied after the post readout gradient rewinder pulse 96 and prior to the data acquisition window 100. The 2*θ degree inversion pulse 102 is used to regain signal that has been reversibly eliminated via T2* decay mechanisms, i.e., by main magnet and susceptibility inhomogeneities. Following application of the 2*θ degree inversion pulse 102, echo 104 is produced and is sampled without a frequency encoding readout gradient for data collection during low bandwidth data acquisition window 106. Data sampled from echo 104 is Fourier transformed to obtain a center frequency spectrum.

To overcome the drawbacks of conventional separate pre-scan object projection data acquisition and center frequency data acquisition sequences, the present invention includes the acquisition of both the object projection pre-scan data and the center frequency pre-scan data during application of a single pre-scan pulse sequence. The object projection pre-scan data and the center frequency pre-scan data are used to simultaneously obtain and display an object projection plot and a center frequency spectrum to an MR system operator. This technique is described in greater detail with respect to FIG. 4.

Figure 4:
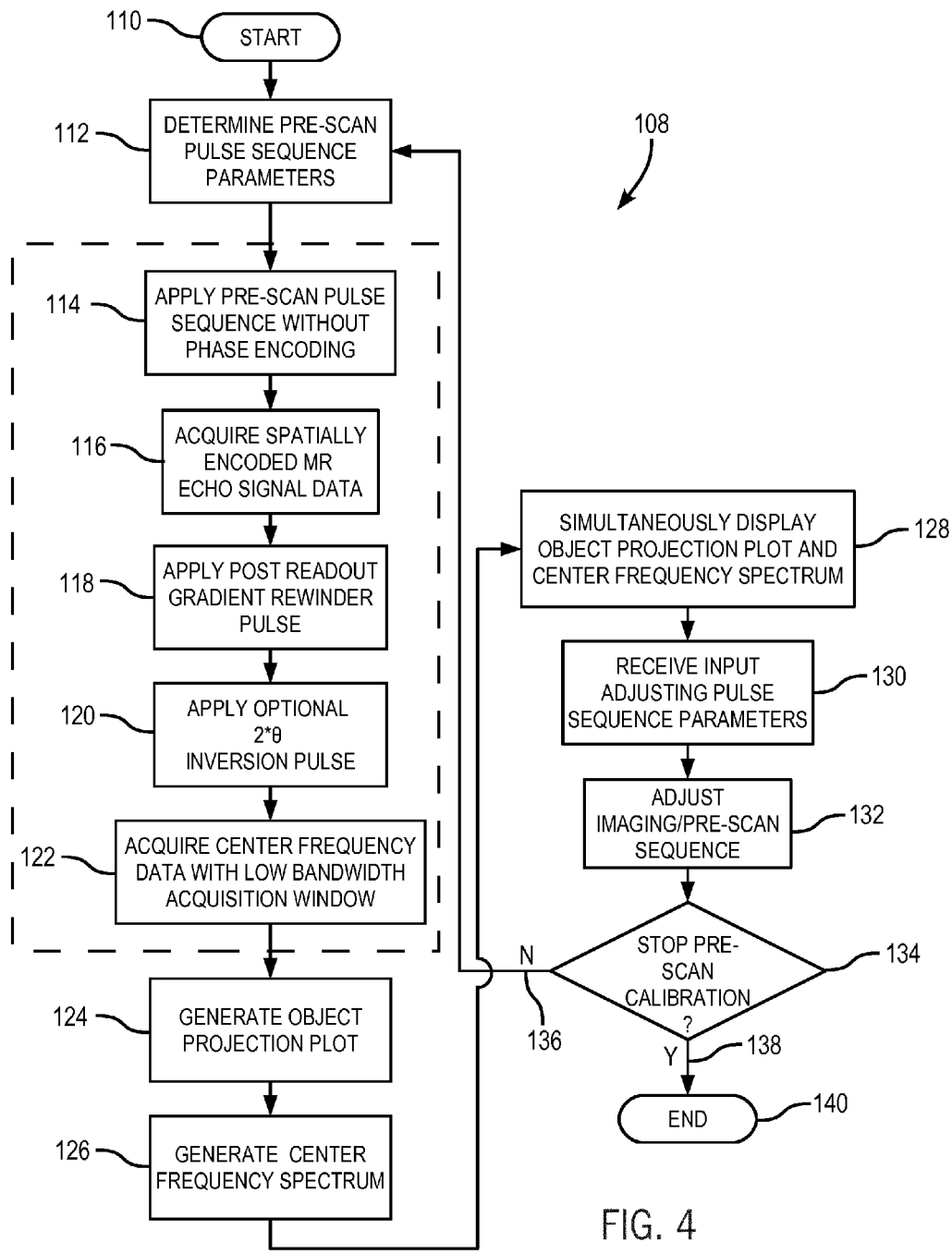
FIG. 4 is a flow chart setting forth the steps of interactively determining parameters for the pulse sequence illustrated in FIG. 2 in accordance with one aspect of the invention.

As shown in FIG. 4, an interactive technique 108 is shown and begins at 110 with user prescription of scan parameters for an impending scan. These initial scan parameters may include, but are not limited to, a center frequency, an offset frequency and an amplitude of an RF saturation pulse that may be applied to suppress signal from nuclei that precess at the RF saturation pulse's saturation frequency. Based on the initial parameters for the scan, parameters for a pre-scan pulse sequence are determined at 112. In accordance with the present invention, phase encoding gradients are not applied during application of the pre-scan pulse sequence at 114. Spatially encoded MR echo signal data for use in generating the object projection plot is acquired in the presence of a readout gradient during a pre-scan data acquisition window at 116. Following application of the readout gradient, a post readout gradient rewinder pulse is applied at 118, and a 2*θ degree inversion pulse is optionally applied at 120. Center frequency data is acquired at 122 during a pre-scan data acquisition window. Preferably, the pre-scan data acquisition window for acquiring the center frequency data has a lower bandwidth than the bandwidth of the pre-scan data acquisition window for acquiring object projection MR data. An object projection plot is generated at 124, and a center frequency spectrum is generated at 126. Both of these are generated by applying a Fourier transform to the respective acquired data. The object projection plot and the center frequency spectrum are simultaneously displayed to the user at 128.

Technique 108 continues at 130 with the reception of one or more adjustments to the scan parameters determined by a user in real time or automatically obtained by a computer from a predetermined database of values. For instance, a user input may be received for adjusting the center frequency. Accordingly, the imaging pulse sequence parameters and/or the pre-scan pulse sequence parameters are adjusted at 132 based on the user adjustments. It is contemplated that one or more scan parameters may be automatically adjusted by the computer based on automatic observations of the center frequency spectrum and the object projection data of the pre-scan data as well as a result of adjustments to user-defined parameters.

The pre-scan acquisition loop is iterated until the user or computer requests it to stop. With each iteration, it is contemplated that the parameters used to acquire the pre-scan data are changed based on one or more inputs received after user visualization of the object projection plot and the center frequency spectrum or automatic changes that are made. If the calibration process does not stop 134, 136, the loop returns to step 112 with determination of the corresponding pre-scan parameters followed by execution of steps 114-132 heretofore described. Once calibration is terminated 134, 138, technique 108 ends at 140 with finalization of the imaging pulse sequence parameters and execution of an imaging pulse sequence in accordance with conventional imaging techniques. Thus, in a preferred embodiment, the pre-scan pulse sequence automatically repeats steps 112-132 with the user and/or automatic changes until the user or computer has signaled that the pre-scan process is complete. It is also contemplated, however, that the pre-scan acquisition loop can be pre-set to run a certain number of times and therefore not require the user or computer to "stop" the process. It is further contemplated that the object projection plot and the center frequency spectrum may be automatically analyzed with one of a number of analysis techniques and the pre-scan acquisition loop reiterated until the analysis indicates that optimal (or near-optimal) settings have been reached.

The heretofore described technique, which may be embodied in a computer program stored on a computer readable storage medium or in a computer data signal transmitted in a carrier wave, advantageously enables a user to correctly and optimally set the parameters of an imaging pulse sequence, (e.g., transmit gain, center frequency), during manual pre-scan calibration of the imaging pulse sequence. By acquiring both the object projection pre-scan data and the center frequency pre-scan data from the same spatial slice, the user may simultaneously view the object projection plot and the center frequency spectrum displays obtained from the same spatial slice without system software delays or MR physics-related delays involved with switching between two different acquisition sequences.

Therefore, the invention includes a computer program stored on a computer readable storage medium and having instructions which, when executed by a computer, cause the computer to apply a pre-scan readout gradient pulse of a pulse sequence from a region-of-interest to be imaged. A first set of MR signals is acquired from the region-of-interest during application of the pre-scan readout gradient pulse. The instructions further cause the computer to apply a pre-scan readout gradient rewinder pulse of the pulse sequence after application of the pre-scan readout gradient pulse. A second set of MR signals is acquired from the region-of-interest after application of the pre-scan readout gradient rewinder pulse.

The invention is also directed to an MR apparatus that includes an MR system having a plurality of gradient coils positioned about a bore of a magnet to impress a polarizing magnetic field. An RF transceiver system and an RF switch are controlled by a pulse module to transmit and receive RF signals to and from an RF coil assembly to acquire MR images. The MR apparatus also includes a computer readable storage medium having stored thereon a computer program comprising instructions which when executed by a computer cause the computer to apply an MR acquisition pulse sequence having a readout gradient pulse and a post readout gradient rewinder pulse. The computer is also caused to read out a first set of MR data from a spatial slice of a region-of-interest while applying the readout gradient pulse and read out a second set of MR data from the spatial slice of the region-of-interest after applying the post readout gradient rewinder pulse.

The invention is further embodied in a method of acquiring MR pre-scan image data. The method includes prescribing a pre-scan pulse sequence for a slice of a region of interest, the pre-scan pulse sequence having a first data acquisition window and a second data acquisition window. The method includes acquiring MR signals from the slice during the first data acquisition window and applying a gradient rewinder pulse between the first data acquisition window and the second data acquisition window. MR signals are acquired from the slice during the second data acquisition window.

The present invention has been described in terms of the preferred embodiment, and it is recognized that equivalents, alternatives, and modifications, aside from those expressly stated, are possible and within the scope of the appending claims.

What is claimed is:

1. A computer readable storage medium having stored thereon a computer program comprising instructions which when executed by a computer cause the computer to:
    apply a pre-scan readout gradient pulse of a pulse sequence from a region-of-interest to be imaged;
    acquire a first set of MR signals from the region-of-interest during application of the pre-scan readout gradient pulse;
    apply a pre-scan readout gradient rewinder pulse of the pulse sequence after application of the pre-scan readout gradient pulse;
    acquire a second set of MR signals from the region-of-interest after application of the pre-scan readout gradient rewinder pulse;
    generate a center frequency spectrum from the second set of MR signals; and
    display the center frequency spectrum to the user.

2. The computer readable storage medium of claim 1 wherein generating the center frequency spectrum includes applying a Fourier transform to the acquired second set of MR signals.

3. The computer readable storage medium of claim 1 wherein the instructions further cause the computer to:
    generate an object projection from the first set of MR signals; and
    display the object projection to a user.

4. The computer readable storage medium of claim 3 wherein generating the object projection includes applying a Fourier transform to the acquired first set of MR signals.

5. The computer readable storage medium of claim 3 wherein the instructions further cause the computer to simultaneously display the center frequency spectrum and the object projection to the user.

6. The computer readable storage medium of claim 1 wherein the instructions further cause the computer to apply a 180 degree inversion pulse following application of the pre-scan readout gradient rewinder pulse.

7. The computer readable storage medium of claim 6 wherein the instructions further cause the computer to apply the 180 degree inversion pulse before acquiring the second set of MR signals.

8. The computer readable storage medium of claim 1 wherein the instructions further cause the computer to:
    acquire the first set of MR signals during a first data acquisition window; and
    acquire the second set of MR signals during a second data acquisition window without a readout gradient, the second data acquisition window having a bandwidth lower than a bandwidth of the first data acquisition window.

9. The computer readable storage medium of claim 1 wherein the instructions further cause the computer to acquire the second set of MR signals in the absence of a simultaneous readout gradient.

10. An MR apparatus comprising:
    an MR system having a plurality of gradient coils positioned about a bore of a magnet to impress a polarizing magnetic field and an RF transceiver system and an RF switch controlled by a pulse module to transmit RF signals to an RF coil assembly to acquire MR images; and
    a computer readable storage medium having stored thereon a computer program comprising instructions which when executed by a computer cause the computer to:
        apply an MR acquisition pulse sequence having a readout gradient pulse and a post readout gradient rewinder pulse;
        read out a first set of MR data from a spatial slice of a region-of-interest while applying the readout gradient pulse;
        read out a second set of MR data from the spatial slice of the region-of-interest after applying the post readout gradient rewinder pulse;
        generate an object projection plot from the first set of MR data read out while applying the readout gradient pulse; and
        generate a center frequency spectrum from a second set of MR data read out after applying the post readout gradient rewinder pulse.

11. The MR apparatus of claim 10 wherein the computer is further caused to:
    read out the second set of MR data without a readout gradient; and
    read out the second set of MR data at a lower bandwidth than a bandwidth of the read out of the first set of MR data.

12. The MR apparatus of claim 10 wherein the computer is further caused to simultaneously display the object projection plot and the center frequency spectrum to a user.

13. The MR apparatus of claim 12 wherein the computer is further caused to receive a series of user-inputs setting forth scan parameters for the MR acquisition pulse sequence based on observations of the user from the simultaneous display of the object projection plot and the center frequency spectrum.

14. The MR apparatus of claim 10 wherein the computer is further caused to apply a Fourier transform to each of the first set of MR data and the second set of MR data.

15. The MR apparatus of claim 10 wherein the computer is further caused to apply a $2*\theta$ degree inversion pulse after applying the post readout gradient rewinder pulse.

16. The MR apparatus of claim 15 wherein the computer is further caused to apply the $2*\theta$ degree inversion pulse before reading out the second set of MR data.

17. A method of acquiring MR pre-scan image data comprising:
    prescribing a pre-scan pulse sequence for a slice of a region of interest, the pre-scan pulse sequence having a first data acquisition window and a second data acquisition window;
    acquiring MR signals from the slice during the first data acquisition window;
    applying a gradient rewinder pulse between the first data acquisition window and the second data acquisition window;

acquiring MR signals from the slice during the second data acquisition window; and at least temporarily storing the MR signals acquired during the first and second data acquisition window in computer memory.

18. The method of claim 17 further comprising determining a center frequency spectrum from the MR signals acquired during the second data acquisition window.

19. The method of claim 18 wherein determining the center frequency spectrum comprises applying a Fourier transform to the MR signals acquired during the second data acquisition window.

20. The method of claim 18 further comprising determining an object projection plot from the MR signals acquired during the first data acquisition window.

21. The method of claim 20 further comprising simultaneously displaying the center frequency spectrum and the object projection plot to a user.

22. The method of claim 17 further comprising applying a readout gradient during the first data acquisition window.

23. The method of claim 22 wherein acquiring MR signals from the slice during the second data acquisition window comprises acquiring MR signals without application of a readout gradient during the second data acquisition window.

24. The method of claim 23 further comprising:
acquiring MR signals from the slice during the first data acquisition window at a first bandwidth; and
acquiring MR signals from the slice during the second data acquisition window at a second bandwidth, the second bandwidth lower than the first bandwidth.

25. The method of claim 17 further comprising:
acquiring MR signals from the slice during the first data acquisition window with a first number of samples; and
acquiring MR signals from the slice during the second data acquisition window with a second number of samples, the second number of samples different than the first number of samples.

26. A computer readable storage medium having stored thereon a computer program comprising instructions which when executed by a computer cause the computer to:
apply a pre-scan readout gradient pulse of a pulse sequence from a region-of-interest to be imaged;
acquire a first set of MR signals from the region-of-interest during application of the pre-scan readout gradient pulse;
apply a pre-scan readout gradient rewinder pulse of the pulse sequence after application of the pre-scan readout gradient pulse;
acquire a second set of MR signals from the region-of-interest after application of the pre-scan readout gradient rewinder pulse;
acquire the first set of MR signals during a first data acquisition window;
acquire the second set of MR signals during a second data acquisition window without a readout gradient, the second data acquisition window having a bandwidth lower than a bandwidth of the first data acquisition window at least temporally storing the MR signals acquired during the first and second data acquisition window in a computer memory.

27. A computer readable storage medium having stored thereon a computer program comprising instructions which when executed by a computer cause the computer to:
apply a pre-scan readout gradient pulse of a pulse sequence from a region-of-interest to be imaged;
acquire a first set of MR signals from the region-of-interest during application of the pre-scan readout gradient pulse;
apply a pre-scan readout gradient rewinder pulse of the pulse sequence after application of the pre-scan readout gradient pulse;
acquire a second set of MR signals from the region-of-interest after application of the pre-scan readout gradient rewinder pulse, wherein the second set of MR signals is acquired in the absence of a simultaneous readout gradient and generates at least one of an object projection plot and a center frequency spectrum for display to a user.

28. An MR apparatus comprising:
an MR system having a plurality of gradient coils positioned about a bore of a magnet to impress a polarizing magnetic field and an RF transceiver system and an RF switch controlled by a pulse module to transmit RF signals to an RF coil assembly to acquire MR images; and
a computer readable storage medium having stored thereon a computer program comprising instructions which when executed by a computer cause the computer to:
apply an MR acquisition pulse sequence having a readout gradient pulse and a post readout gradient rewinder pulse;
read out a first set of MR data from a spatial slice of a region-of-interest while applying the readout gradient pulse;
read out a second set of MR data from the spatial slice of the region-of-interest after applying the post readout gradient rewinder pulse;
read out the second set of MR data without a readout gradient; and
read out the second set of MR data at a lower bandwidth than a bandwidth of the read out of the first set of MR data.

* * * * *